(12) United States Patent
Murin et al.

(10) Patent No.: US 8,321,623 B2
(45) Date of Patent: Nov. 27, 2012

(54) AD HOC FLASH MEMORY REFERENCE CELLS

(75) Inventors: Mark Murin, Kfar Saba (IL); Eran Sharon, Rishon Lezion (IL)

(73) Assignee: SanDisk IL Ltd, Kfar Saba (IL)

( * ) Notice: Subject to any disclaimer, the term of this patent is extended or adjusted under 35 U.S.C. 154(b) by 634 days.

(21) Appl. No.: 12/434,650

(22) Filed: May 3, 2009

(65) Prior Publication Data

US 2009/0319722 A1    Dec. 24, 2009

Related U.S. Application Data

(60) Provisional application No. 61/074,705, filed on Jun. 23, 2008.

(51) Int. Cl.
G06F 13/00 (2006.01)
G11C 16/04 (2006.01)
G11C 16/06 (2006.01)
G11C 16/28 (2006.01)

(52) U.S. Cl. ............... 711/103; 365/185.09; 365/185.2; 365/200

(58) Field of Classification Search .................. 711/103; 365/185.09, 185.2, 200

See application file for complete search history.

(56) References Cited

U.S. PATENT DOCUMENTS

| | | | |
|---|---|---|---|
| 5,991,517 A | 11/1999 | Harari et al. | |
| 6,490,212 B1* | 12/2002 | Nguyen et al. | 365/207 |
| 2002/0176275 A1 | 11/2002 | Pilo et al. | 365/149 |
| 2004/0001353 A1* | 1/2004 | Hidaka | 365/171 |
| 2004/0004856 A1 | 1/2004 | Sakimura et al. | 365/158 |
| 2004/0017718 A1* | 1/2004 | Ooishi | 365/210 |
| 2005/0122774 A1 | 6/2005 | Hidaka | 365/171 |
| 2006/0034137 A1* | 2/2006 | Zanardi | 365/200 |
| 2007/0230263 A1 | 10/2007 | Sakakibara | 365/210 |

* cited by examiner

*Primary Examiner* — J. H. Hur
(74) *Attorney, Agent, or Firm* — Martine Penilla Group, LLP

(57) ABSTRACT

In a nonvolatile memory, that includes cells organized in a plurality of bit lines and a plurality of word lines, user data are stored in respective portions of each of two of the word lines. Control information is stored in a cell that is common to one of the bit lines and one of the two word lines. A cell that is common to the bit line and the other word line is used as a reference cell. A flash memory, that includes a plurality of primary cells and a plurality of spare cells, is interrogated to determine which spare cells have been used to replace respective primary cells. At least some of the other spare cells are used as reference cells.

10 Claims, 3 Drawing Sheets

US 8,321,623 B2

AD HOC FLASH MEMORY REFERENCE CELLS

This patent application claims the benefit of U.S. Provisional Patent Application No. 61/074,705, filed Jun. 23, 2008

FIELD AND BACKGROUND OF THE INVENTION

The present invention relates to flash memories and, more particularly, to the use, as reference cells, of flash memory cells not initially intended to be used for that purpose.

Flash memories are structured as rectangular arrays of memory cells. The cells are arranged in orthogonal bit lines and word lines. One or more bits of data are written to each cell by injecting sufficient electrical charge into a floating gate of the cell to place the cell's threshold voltage within a range of threshold voltages that represents the value of that bit or of those bits. A flash memory cell is read by comparing its threshold voltage to reference voltages that mark the boundaries between threshold voltage ranges. In the case of a NOR flash memory, the cells may be written and read individually. In the case of a NAND flash memory, the cells are written and read one page at a time, with each word line including a small integral number (typically one or two, generally no more than four) of pages. The word lines are grouped further into blocks, such that cells are erased an entire block at a time.

For historical reasons, writing data to a flash memory cell also is called "programming" the cell.

One of the most disturbing issues in operation of Flash memories is the changing of cells' threshold voltage with the time, due to leakage of charge from the cells' floating gates. This phenomenon also is known as "data retention shift". Excess data retention shift may result in errors when reading data from a flash memory, if reading reference voltage levels have not been adjusted in accordance with this shift. However, how can one know how much the cell threshold voltage have been shifted due to data retention shift, or, in other words, how much should the reading reference voltages be adjusted?

One conventional approach for addressing this issue is to assign a certain number of cells in each page as reference cells, to program these cells with a-priori known data, and to "sense" these cells' voltage thresholds in order to evaluate the amount of shift that caused by data retention. Implementing such reference cells in a flash memory system greatly improves the system's ability to cope with the data retention shift phenomenon.

However, in order to be able to get a reliable estimate of the data retention shift using such reference cells, the number of such cells for each flash page is not small. At least several tens of reference cells are required for each voltage level. This is a significant number of cells, especially in "multi-level-cell" flash memory devices that store more than one bit per cell. Adding such a significant number of cells to a flash memory page obviously increases the flash die size and, therefore, the cost of the flash silicon substrate.

Hence, it would be highly advantageous to be able to implement reference cells without increasing the flash memory die size.

SUMMARY OF THE INVENTION

One embodiment provided herein is a method of managing a nonvolatile memory that includes a plurality of cells organized in a plurality of bit lines and a plurality of word lines, the method comprising: (a) storing user data in respective portions of the cells of each of two of the word lines; and (b) in one of the bit lines that is shared by the two word lines: (i) storing control information in a cell common to the one bit line and a first of the two word lines, and (ii) using a cell common to the one bit line and a second of the two word lines as a reference cell.

Another embodiment provided herein is a controller, for a flash memory that includes a plurality of cells organized in a plurality of bit lines and a plurality of word lines, the controller being operative: (a) to store user data in respective portions of the cells of each of two of the word lines; and (b) in one of the bit lines that is shared by the two word lines: (i) to store control information in a cell common to the one bit line and a first of the two word lines, and (ii) to use a cell common to the one bit line and a second of two word lines as a reference cell.

Another embodiment provided herein is a flash memory device comprising: (a) a flash memory including a plurality of cells organized in a plurality of bit lines and a plurality of word lines; and (b) a controller operative: (i) to store user data in respective portions of the cells of each of two of the word lines, and (ii) in one of the bit lines that is shared by the two word lines: (A) to store control information in a cell common to the one bit line and a first of the two word lines, and (B) to use a cell common to the one bit line and a second of two word lines as a reference cell.

Another embodiment provided herein is a system comprising: (a) a flash memory including a plurality of cells organized in a plurality of bit lines and a plurality of word lines; (b) a host, of the flash memory, including: (i) a memory for storing code for managing the flash memory by steps including: (A) storing user data in respective portions of the cells of each of two of the word lines, and (B) in one of the bit lines that is shared by the two word lines: (I) storing control information in a cell common to the one bit line and a first of the two word lines, and (II) using a cell common to the one bit line and a second of the two word lines as a reference cell, and (ii) a processor for executing the code.

Another embodiment provided herein is a computer-readable storage medium having embodied thereon computer-readable code for managing a flash memory that includes a plurality of cells organized in a plurality of bit lines and a plurality of word lines, the computer-readable code comprising: (a) program code for storing user data in respective portions of the cells of each of two of the word lines; and (b) program code for, in one of the bit lines that is shared by the two word lines: (i) storing control information in a cell common to the one bit line and a first of the two word lines, and (ii) using a cell common to the one bit line and a second of the two word lines as a reference cell.

Another embodiment provided herein is a method of managing a flash memory that includes a plurality of primary cells and a plurality of spare cells, the method comprising: (a) interrogating the flash memory to determine which spare cells have been used to replace respective primary cells; and (b) using, as reference cells, at least a portion of a remainder of the spare cells.

Another embodiment provided herein is a controller, for a flash memory that includes a plurality of primary cells and a plurality of spare cells, the controller being operative: (a) to interrogate the flash memory to determine which spare cells have been used to replace respective primary cells; and (b) to use, as reference cells, at least a portion of a remainder of the spare cells.

Another embodiment provided herein is a flash memory device comprising: (a) a flash memory including a plurality of primary cells and a plurality of spare cells; and (b) a controller operative: (i) to interrogate the flash memory to determine which spare cells have been used to replace respective primary cells, and (ii) to use, as reference cells, at least a portion of a remainder of the spare cells.

Another embodiment provided herein is a system, comprising: (a) a flash memory including a plurality of primary cells and a plurality of spare cells; and (b) a host, of the flash memory, including: (i) a memory for storing code for managing the flash memory by steps including: (A) interrogating the flash memory to determine which spare cells have been used to replace respective primary cells, and (B) using, as reference cells, at least a portion of a remainder of the spare cells, and (ii) a processor for executing the code.

Another embodiment provided herein is a computer-readable storage medium having embodied thereon computer-readable code for managing a flash memory that includes a plurality of primary cells and a plurality of spare cells, the computer-readable code comprising: (a) program code for interrogating the flash memory to determine which spare cells have been used to replace respective primary cells; and (b) program code for using, as reference cells, at least a portion of a remainder of the spare cells.

Two general methods are presented herein for ad hoc designation of reference cells of a memory. The first method is not restricted to flash memories, but is directed at managing any nonvolatile memory that includes a plurality of cells organized in a plurality of bit lines and a plurality of word lines. The second method is specific to flash memories, and is directed to managing a flash memory that includes a plurality of primary cells and a plurality of spare cells.

According to the first general method, user data are stored in respective portions of the cells of each of two of the word lines. In one of the bit lines that is shared by the two word lines, control information is stored in a cell common to the bit line and to one of the word lines, and a cell that is common to the bit line and to the other word line is used as a reference cell for reading at least one other cell of the memory. Note that the two cells in question are cells that are not used to store user data.

Preferably, the user data are stored only in cells other than the cells of the one bit line that includes the reference cell. For example, in the example presented in the preferred embodiments below, the cells that are used to store user data are the cells of section 108, the cell that is used to store control information is a cell of section 110, and the cell that is used as a reference cell is another cell of section 110.

In some embodiments, the two word lines are in the same, erase block of the nonvolatile memory. In such embodiments, preferably, the control information is block-level management information for managing the shared block, as opposed to e.g. page-level management information for managing a page that is stored in one of the word lines. In other embodiments, the two word lines are in separate respective erase blocks of the nonvolatile memory. In some such embodiments, the control information is error correction code information.

According to the second general method, the flash memory is interrogated to determine which spare cells have been used to replace respective primary cells. At least a portion of the remaining spare cells (i.e., one or more spare cells that have not been used to replace respective primary cells) is used as reference cells for reading at least some of the primary cells that have not been replaced and/or for reading at least some of the spare cells that have been used to replace primary cells.

A memory controller that implements the first general method is operative to store user data in respective portions of the cells of each of two of the word lines, and, in one of the bit lines that is shared by the two word lines, to store control information in a cell common to the bit line and to one of the word lines, and to use a cell common to the bit line and to the other word line as a reference cell.

A flash memory controller that implements the second general method is operative to interrogate the flash memory to determine which spare cells have been used to replace respective primary cells, and to use, as reference cells, at least a portion of the other spare cells.

A memory device that corresponds to one of the two general methods includes a memory and a controller that manages the memory according to the relevant general method.

A system that corresponds to one of the two general methods includes a first memory, a second memory and a processor. The second memory is for storing code for implementing the relevant general method to manage the first memory. The processor executes the code. A computer readable storage medium that corresponds to one of the two general methods has embedded thereon computer code for managing a memory using the relevant general method.

BRIEF DESCRIPTION OF THE DRAWINGS

Various embodiments are herein described, by way of example only, with reference to the accompanying drawings, wherein.

DESCRIPTION OF THE PREFERRED EMBODIMENTS

The principles and operation of a flash memory according to the present invention may be better understood with reference to the drawings and the accompanying description.

Figure 1:
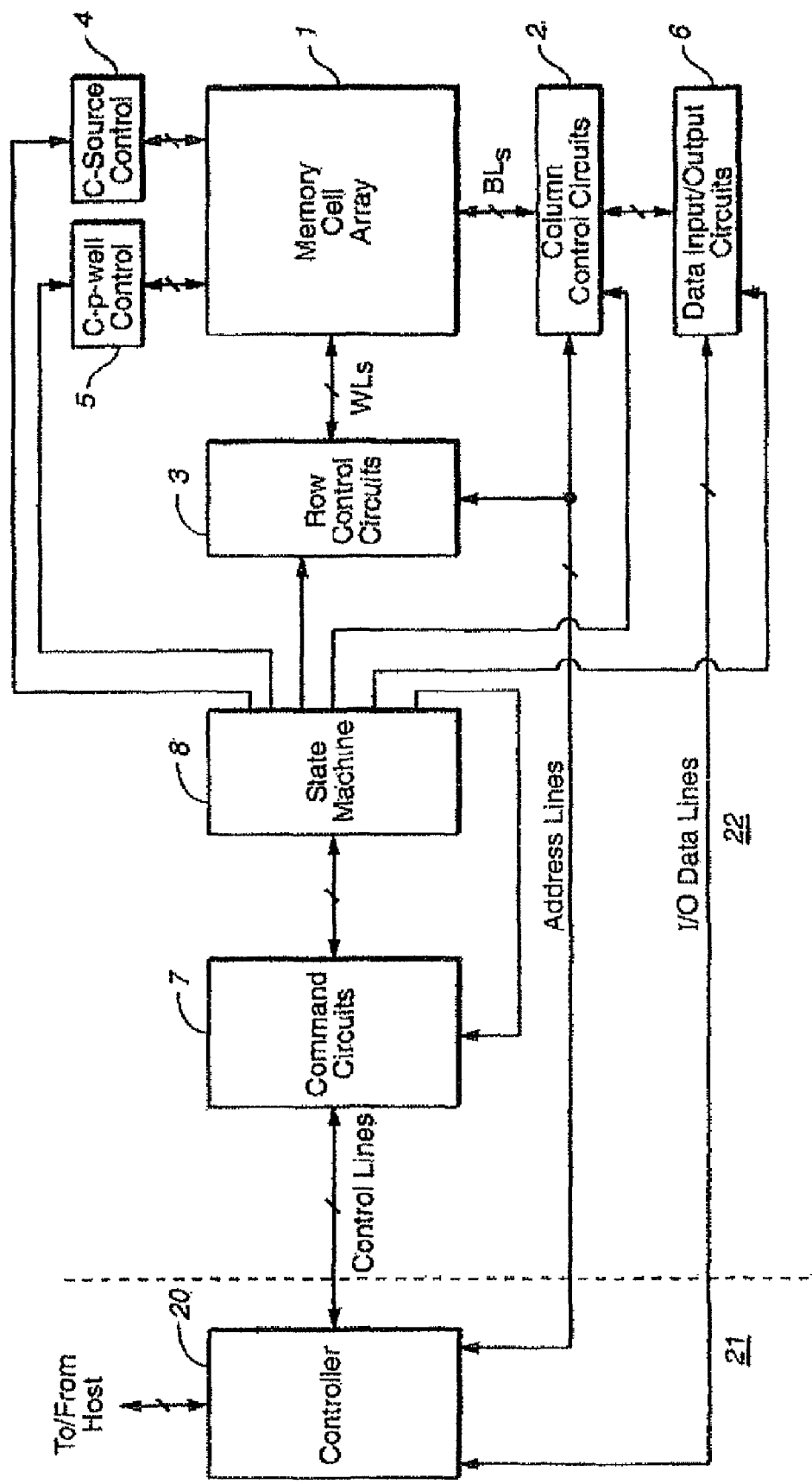
FIG. 1 is a high-level schematic block diagram of a flash memory device in which ad hoc designation of reference cells is effected by a controller.

Referring now to the drawings, FIG. 1 is a high-level schematic block diagram of a flash memory device. A memory cell array 1 including a plurality of memory cells M arranged in a matrix is controlled by a column control circuit 2, a row control circuit 3, a c-source control circuit 4 and a c-p-well control circuit 5. Column control circuit 2 is connected to bit lines (BL) of memory cell array 1 for reading data stored in the memory cells (M), for determining a state of the memory cells (M) during a writing operation, and for controlling potential levels of the bit lines (BL) to promote the writing or to inhibit the writing. Row control circuit 3 is connected to word lines (WL) to select one of the word lines (WL), to apply read voltages, to apply writing voltages combined with the bit line potential levels controlled by column control circuit 2, and to apply an erase voltage coupled with a voltage of a p-type region on which the memory cells (M) are formed. C-source control circuit 4 controls a common source line connected to the memory cells (M). C-p-well control circuit 5 controls the c-p-well voltage.

The data stored in the memory cells (M) are read out by column control circuit 2 and are output to external I/O lines via I/O data lines and a data input/output buffer 6. Program data to be stored in the memory cells are input to data input/output buffer 6 via the external I/O lines, and are transferred to column control circuit 2. The external I/O lines are connected to a controller 20.

Command data for controlling the flash memory device are input to a command interface connected to external control lines which are connected with controller 20. The command data inform the flash memory of what operation is requested. The input command is transferred to a state machine 8 that controls column control circuit 2, row control circuit 3, c-source control circuit 4, c-p-well control circuit 5 and data input/output buffer 6. State machine 8 can output a status data of the flash memory such as READY/BUSY or PASS/FAIL.

Controller 20 is connected or connectable with a host system such as a personal computer, a digital camera, a personal digital assistant. It is the host which initiates commands, such as to store or read data to or from the memory array 1, and provides or receives such data, respectively. Controller 20 converts such commands into command signals that can be interpreted and executed by command circuits 7. Controller 20 also typically contains buffer memory for the user data being written to or read from the memory array. A typical memory device includes one integrated circuit chip 21 that includes controller 20, and one or more integrated circuit chips 22 that each contains a memory array and associated control, input/output and state machine circuits. The trend, of course, is to integrate the memory array and controller circuits of such a device together on one or more integrated circuit chips. The memory device may be embedded as part of the host system, or may be included in a memory card that is removably insertable into a mating socket of host systems. Such a card may include the entire memory device, or the controller and memory array, with associated peripheral circuits, may be provided in separate cards.

Figure 2:
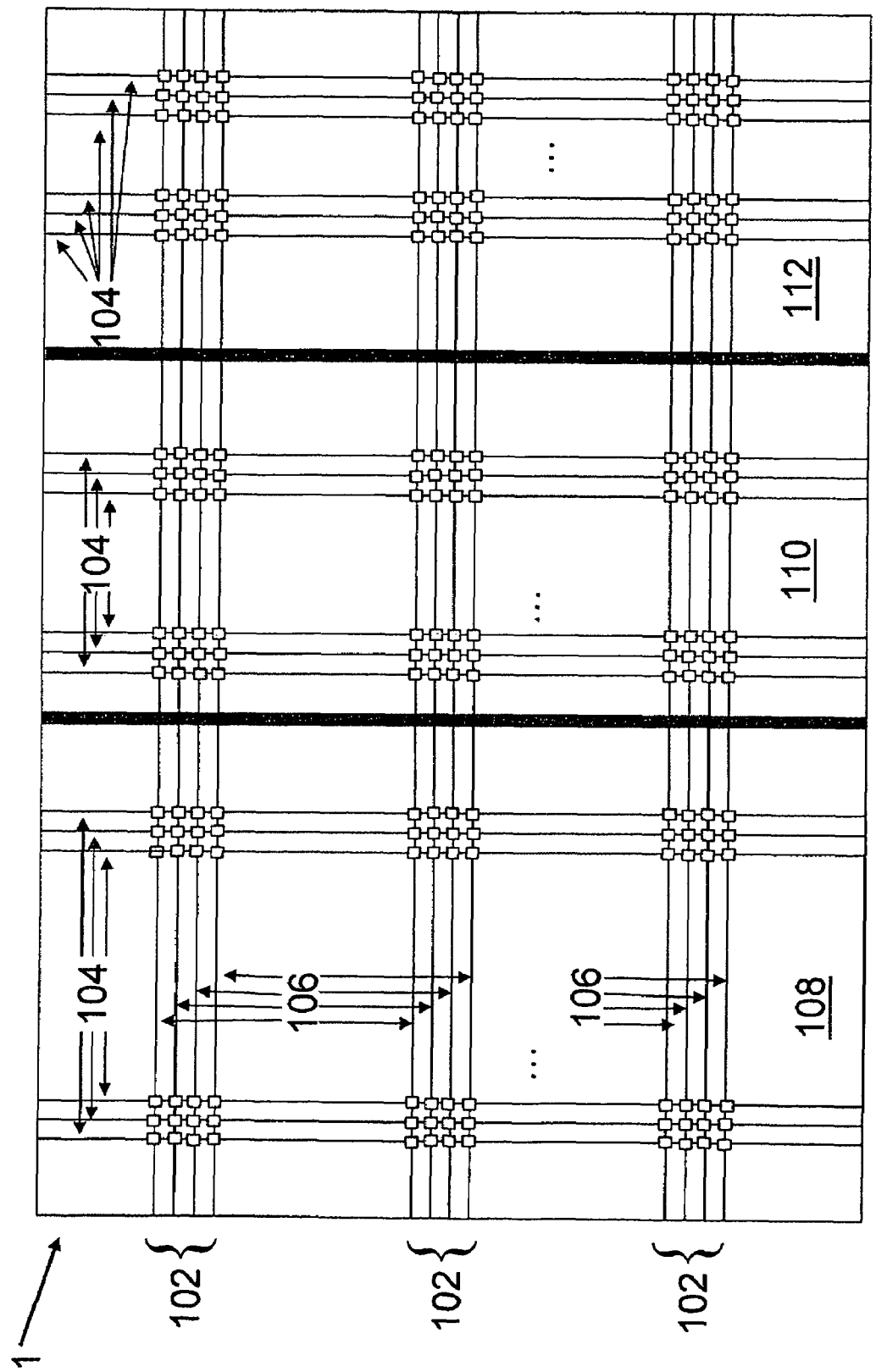
FIG. 2 shows some details of one exemplary memory cell array of a flash memory device of FIG. 1.

FIG. 2 shows some details of one exemplary memory cell array 1. The memory cell array 1 of FIG. 2 includes three erase blocks 102. Each erase block 102 includes four word lines 106. (Erase blocks normally include many more than four word lines. The example of FIG. 2 shows four word lines per erase block for simplicity.) Perpendicular to word lines 106 are many bit lines 104. (The ellipses in FIG. 2 mean that there are many more bit lines 104 between the indicated bit lines 104.) The squares at the intersections of word lines 106 and bit lines 104 represent memory cells. Thus, as described above, the memory cells of array 1 are a rectangular array of cells, with each column of cells on a shared bit line 104 and each row of cells on a shared word line 106.

Memory cell array 1 of FIG. 2 is divided into three sections, with the cells of each section being used for a different purpose. Section 108 is a data section. The cells of section 108 are used to store data. Section 110 is a control section. The cells of section 110 are used to store control and management information such as error correction code (ECC) bits for the data in section 108. Section 112 is a redundant section. The cells of section 112 are called "redundant column cells" and are used to compensate for (i.e., to replace) bad bit lines 104 in sections 108 and 110. (In some of the appended claims, the cells of section 108 and 110 are called "primary cells" and the cells of section 112 are called "spare cells".) During the initial testing of the device of FIG. 1, bad bit lines 104 are detected and are "replaced" by good bit lines 104 of section 112 by being remapped to good bit lines 104 of section 112. This remapping information is recorded in the device of FIG. 1.

Flash memory cell array 1 is designed with enough redundant bit lines 104 in section 112 to cover even rare cases, in which a significant number of bit lines 104 in sections 108 and 110 are bad. Experience shows, however, that in most cases only a small number of bit lines 104 have to be remapped bit lines. Therefore, most of the redundant bit lines 104 are statistically unused, and are free to be used as reference cells.

In order for the cells of redundant bit lines 104 to be used as reference cells, controller 20 is configured to perform the following, in normal mode of operation:
Get column remapping information
Enable access (read and program) to redundant bit lines 104.

It should be noted, that conventional flash memory devices already enable these controller actions in special operation modes, intended for flash memory device testing.

The number of flash memory cells that are used as reference cells may be further increased if additional cells, that are not used to store data, are assigned for this purpose.

One "source" of such cells is bit lines 104 in section 110, if part of this section is not used for ECC or for flash memory management purposes.

Another "source" of reference cells is portions of bit lines 104 that are used in some word lines 106 of a block 102 and are unused in other word lines 106, or, alternatively, are used in some blocks 102 along a word line 106 and are "free" in other blocks 102.

The situation in which some word lines 106 of a block 102 may use cells of bit lines 104, while other word lines 106 of the block 102 do not use cells of these bit lines 102, may happen if the cells of these bit lines 104 have been assigned to store block-level management data. In such a case it may not be necessary to use the cells of these bit lines 104 in all the word lines 106 of the block 102 and unused cells may be assigned to be reference cells.

Similarly, if the flash memory device includes different logical types of blocks 102 in the same plane, some of these blocks 102 may have certain bit lines 104 used to store data, while other blocks 102 may have these bit lines 104 free. One example of such a situation is a flash memory device whose blocks 102 are programmed with different numbers of bits-per-cell (e.g. some blocks 102 are SLC ("single level cell") blocks that store one bit per cell while other blocks 102 are MLC ("multi-level cell") blocks that store two or more bits per cell, as an example) and hence have different ECC requirements, which result in different numbers of bit lines 104 assigned to store ECC bits. In such a case, while MLC blocks 102 have all the bit lines 104 of section 110 occupied, SLC blocks 102 have some bit lines 104 of section 110 free.

While it is conventional to use reference cells in a flash memory device for estimating threshold voltage drift, the cells that are used for that purpose are cells that are both pre-assigned as reference cells and located on dedicated bit lines. The technology described herein uses reference cells that are either not pre-assigned as reference cells or not located on dedicated bit lines, specifically according to the following configurations—

A. Within a given block 102 and on the same bit line 104, some cells are used as management data cells and other cells are used as reference cells. Example—having some cells in management section 110 of one word line 106 of a block 102 store control information, while the corresponding cells in the other word lines 106 of the block 102 are used as reference cells.

B. Within a given flash memory die and on corresponding bit lines 104 in different blocks 102 (even in the same plane), some cells are used as management data cells and other cells used as reference cells. Example—blocks 102 used in MLC mode store ECC parity bits in the cells of some bit lines 104, while the cells of corresponding bit lines 104 (or of the same bit lines 104) in blocks 102 used in SLC mode are used as reference cells.

C. Within a given lot of flash dies (including within the dies of the same wafer), the cells of some bit lines 104 are used as data cells and the cells of other bit lines 104 used as reference cells. Example—one flash die having a large number of bad bit lines 104 causing almost all the redundant bit lines 104 of section 112 to be used as data bit lines, while in another flash die almost all bit lines 104 are good ones and the redundant bit lines 104 of section 112 are used as reference cells.

Figure 3:
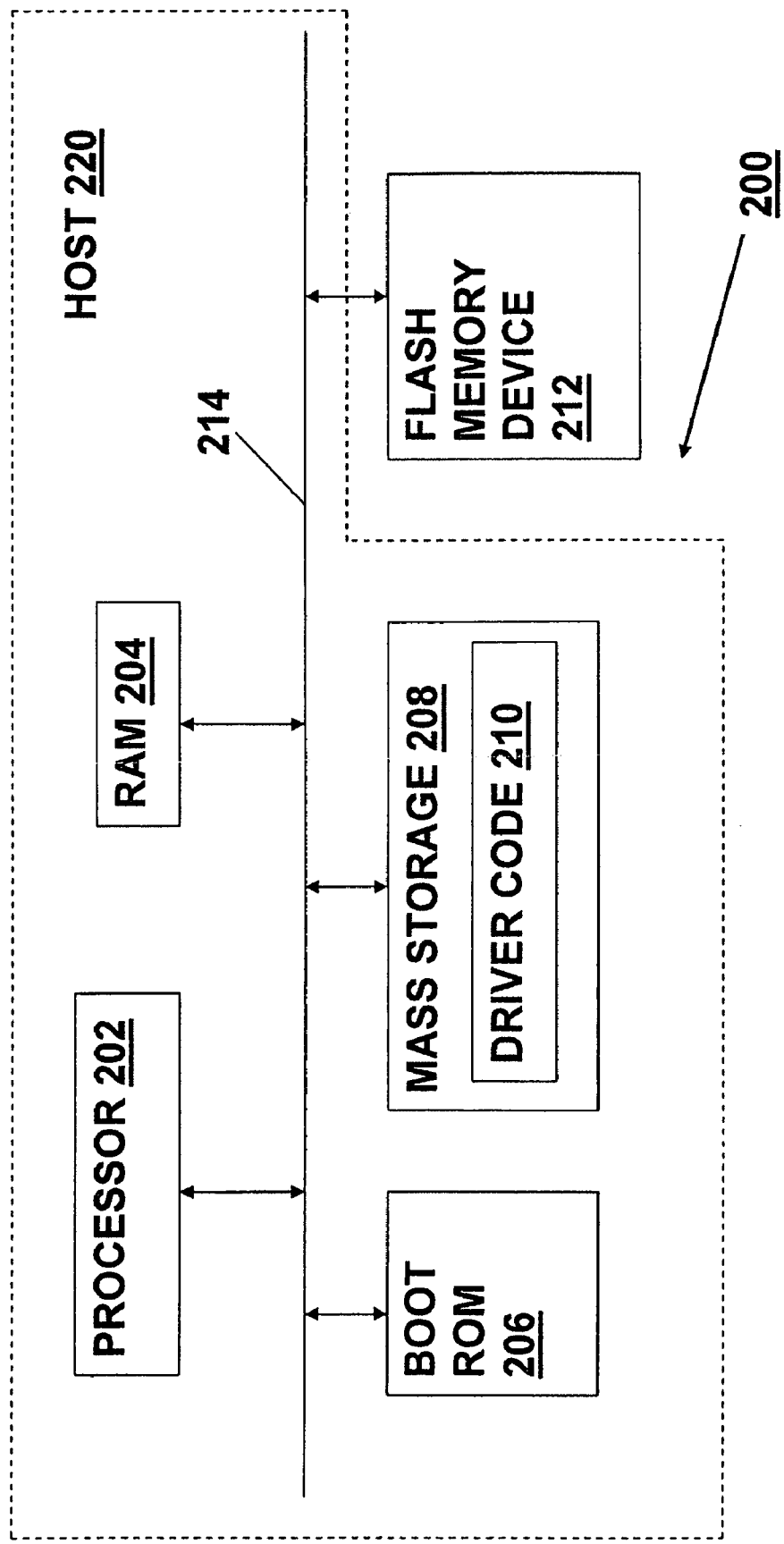
FIG. 3 is a high-level block diagram of a system in which ad hoc designation of reference cells of a flash memory is effected by software.

FIG. 3 is a high-level block diagram of a system 200 in which the ad hoc designation of reference cells of a flash memory is effected by software. System 200 includes a processor 202 and four memory devices: a RAM 204, a boot ROM 206, a mass storage device (hard disk) 208 and a flash memory device of FIG. 1 as a flash memory device 212, all communicating via a common bus 214. In system 200, controller 20 of flash memory device 212 functions only as an interface to bus 214; the rest of the functionality of flash controller 20 of FIG. 1 as described above is emulated by flash memory driver code 210 that is stored in mass storage device 208 and that is executed by processor 202 to interface between user applications executed by processor 202 and flash memory device 212, and to manage the flash memory of flash memory device 212. In addition to the conventional functionality of such flash management driver code, driver code 210 emulates the functionality of controller 20 of FIG. 1 with respect to using, as reference cells, cells of memory cell array 1 that otherwise would not be used for any purpose, as described above. Driver code 210 typically is included in operating system code for system 200 but also could be freestanding code.

The components of system 200 other than flash memory device 212 constitute a host 220 of flash memory device 212. Mass storage device 208 is an example of a computer-readable storage medium bearing computer-readable driver code for using, as reference cells of a flash memory array, cells of the flash memory array that otherwise would not be used for any purpose. Other examples of such computer-readable storage media include read-only memories such as CDs bearing such code.

A limited number of embodiments of methods for ad hoc designation of reference cells of a flash memory, and of a device and system that use the methods, have been described. It will be appreciated that many variations, modifications and other applications of the methods, device and system may be made.

What is claimed is:

1. A method of managing a nonvolatile memory that includes a plurality of cells organized in a plurality of bit lines and a plurality of word lines, the method comprising:
   (a) storing user data in respective portions of the cells of each of two of the word lines; and
   (b) in one of the bit lines that is shared by the two word lines:
      (i) storing control information in a cell corresponding to the one bit line and a first of the two word lines, and
      (ii) using a cell corresponding to the one bit line and a second of the two word lines as a reference cell.

2. The method of claim 1, wherein the user data are stored only in cells other than the cells of the one bit line that includes the reference cell.

3. The method of claim 1, wherein the first and second word lines are in a common block of the nonvolatile memory.

4. The method of claim 3, wherein said control information is block-level management information for managing the common block.

5. The method of claim 1, wherein the first and second word lines are in separate respective blocks of the nonvolatile memory.

6. The method of claim 5, wherein the control information is error correction code information.

7. A controller, for a flash memory that includes a plurality of cells organized in a plurality of bit lines and a plurality of word lines, the controller being operative:
   (a) to store user data in respective portions of the cells of each of two of the word lines; and
   (b) in one of the bit lines that is shared by the two word lines:
      (i) to store control information in a cell corresponding to the one bit line and a first of the two word lines, and
      (ii) to use a cell corresponding to the one bit line and a second of two word lines as a reference cell.

8. A flash memory device comprising:
   (a) a flash memory including a plurality of cells organized in a plurality of bit lines and a plurality of word lines; and
   (b) a controller operative:
      (i) to store user data in respective portions of the cells of each of two of the word lines, and
      (ii) in one of the bit lines that is shared by the two word lines:
         (A) to store control information in a cell corresponding to the one bit line and a first of the two word lines, and
         (B) to use a cell corresponding to the one bit line and a second of two word lines as a reference cell.

9. A system comprising:
   (a) a flash memory including a plurality of cells organized in a plurality of bit lines and a plurality of word lines;
   (b) a host, of the flash memory, including:
      (i) a memory for storing code for managing the flash memory by steps including:
         (A) storing user data in respective portions of the cells of each of two of the word lines, and
         (B) in one of the bit lines that is shared by the two word lines:
            (I) storing control information in a cell corresponding to the one bit line and a first of the two word lines, and
            (II) using a cell corresponding to the one bit line and a second of the two word lines as a reference cell, and
      (ii) a processor for executing the code.

10. A computer-readable storage medium having embodied thereon computer-readable code for managing a flash memory that includes a plurality of cells organized in a plurality of bit lines and a plurality of word lines, the computer-readable code comprising:
    (a) program code for storing user data in respective portions of the cells of each of two of the word lines; and
    (b) program code for, in one of the bit lines that is shared by the two word lines:
       (i) storing control information in a cell corresponding to the one bit line and a first of the two word lines, and
       (ii) using a cell corresponding to the one bit line and a second of the two word lines as a reference cell.

* * * * *